United States Patent [19]

Jäger et al.

[11] Patent Number: 4,670,678
[45] Date of Patent: Jun. 2, 1987

[54] ROTATING RECTIFYING DEVICE FOR THE EXCITATION OF A SYNCHRONOUS MACHINE

[75] Inventors: Kurt Jäger, Mannheim; Philipp Rösch, Viernheim; Rolf Fischl, Hemsbach; Heinrich Wambsganss, Mannheim, all of Fed. Rep. of Germany

[73] Assignee: Brown, Boveri & Cie Aktiengesellschaft, Mannheim, Fed. Rep. of Germany

[21] Appl. No.: 770,703

[22] Filed: Aug. 29, 1985

Related U.S. Application Data

[63] Continuation-in-part of Ser. No. 569,550, Jan. 9, 1984, abandoned, which is a continuation of Ser. No. 303,927, Sep. 21, 1981, abandoned, which is a continuation of Ser. No. 167,636, Oct. 2, 1979, abandoned.

[51] Int. Cl.$^4$ ............................................. H02K 11/00
[52] U.S. Cl. .................................. 310/68 D; 310/45; 310/59; 310/64; 310/91; 310/114
[58] Field of Search ................... 310/68 D, 68 R, 65, 310/164, 64, 61, 58, 72, 91, 165, 261, 162, 112, 114, 60 R, 52, 57, 59, 43, 45, 62, 63, 163, 264

[56] References Cited

U.S. PATENT DOCUMENTS

| | | | |
|---|---|---|---|
| 3,721,843 | 3/1973 | Spisak | 310/68 R |
| 3,852,628 | 12/1974 | Spisak | 310/68 D |
| 3,866,196 | 2/1975 | Mann | 310/68 R |
| 4,007,389 | 2/1977 | Kuter | 310/68 D |
| 4,052,631 | 10/1977 | Kuter | 310/68 D |
| 4,284,914 | 8/1981 | Hogenlocher | 310/68 D |

OTHER PUBLICATIONS

Brown Boveri Mitteilungen, 1967; pp. 539-553.

Primary Examiner—R. Skudy
Attorney, Agent, or Firm—Herbert L. Lerner; Laurence A. Greenberg

[57] ABSTRACT

Rotating rectifying device for excitation of a synchronous machine. The device includes an armature mounted on the machine shaft in a magnetic field with rotating coils connected to rectifier assemblies mounted on the inside flange surface of a support wheel, also mounted on the machine shaft. Each rectifier assembly has a first cooling body mounted on the inside flange surface, and a second cooling body that is resiliently spring biased with an outwardly facing surface against a disc-shaped semiconductor rectifier that rests with its other surface against the first cooling body. The second cooling body has parallel ribs that project into the circular space formed by the support wheel flange. In one version of the invention the second cooling body and the spring element is of circular construction.

12 Claims, 14 Drawing Figures

ROTATING RECTIFYING DEVICE FOR THE EXCITATION OF A SYNCHRONOUS MACHINE

This is a continuation-in-part of application Ser. No. 569,550, filed Jan. 9, 1984, now abandoned, which was a continuation of application Ser. No. 303,927, filed Sept. 21, 1981, now abandoned, which was a continuation of application Ser. No. 167,636, filed Oct. 2, 1979, now abandoned.

FIELD AND BACKGROUND OF THE INVENTION

The invention relates to a rotating rectifying device for excitation of a synchronous machine, and more particularly to the field excitation of a turbo generator.

DESCRIPTION OF THE PRIOR ART

The prior art shows a rotating rectifying device for the excitation of a synchronous machine with an a-c exciter machine, the rotating armature of which is coupled to the shaft of the synchronous machine, comprising at least one support wheel, at the inner surface of which cooling bodies are arranged, against which disc-shaped semiconductor elements which rectify the a-c current generated in the armature, rest with their one surface. Such an arrangement is known from "Brown Boveri Mitteilungen" 1967, pages 539 to 553.

The excitation of synchronous machines of more recent design and large power rating is supplied, in order to avoid slip rings and brushes, by a-c exciter machines with rotating armature windings, wherein e.g. three-phase current generated in the armature of the exciter machine is rectified in co-rotating rectifier diodes and is fed to the armature of the synchronous machine. In these known designs, the rectifier diodes are provided on cooling bodies fastened on the inside of two support wheels which are arranged on the machine shaft.

In this known arrangement, the one electrode which is facing the cooling body (for instance, the cathode), is cooled well, while only a relatively small amount of heat can flow off from the second electrode which is facing away from the cooling body. Thus, the load-handling capacity of the semiconductor element is limited and cannot reach the same values as in stationary equipment, where direct cooling on both sides is readily realizable.

The prior art is described, e.g. in aforesaid article in BROWN BOVERI MITTEILUNGEN, 1967, pages 539–553, which shows a conventioneal brush-free field excitation arrangement. U.S. Pat. No. 4,007,389 by Küter, shows a multi-phase rectifying bridge circuit. U.S. Pat. Nos. 3,721,843 and 3,852,628 by Spisak also show brush-free rotating rectifiers for field excitation machines.

SUMMARY OF THE INVENTION

It is therefore an object of the invention to improve the heat-dissipating and thereby the load-handling capacity of a semiconductor component of a rotating rectifying device of the type mentioned at the outset, so that larger durrents can be transmitted with semiconductor elements of the same physical size.

As a solution to the problem it is proposed, according to the invention, that a second cooling body is resiliently, by means of a suitable spring element and an insulator holding the disc-shaped rectifier elements against the first cooling body.

In a first embodiment of the invention, it is provided that the spring element is arranged between a boundary surface, facing the machine shaft, of the second cooling body and the insulator. The fastening elements, i. e., the insulator and the spring element, need be designed only for fixing the supports and for centering the disc-shaped semiconductor element relative to the two cooling bodies. The required contact pressure between the surfaces of the semiconductor element and the surfaces of the two cooling bodies resting against them is exerted by the centrifugal forces occurring during the rotation.

It is advantageously provided that the spring element is designed as a generally rectangular frame consisting of four side sections with at least two resilient side sections which rest against the surface of the insulator which is of rectangular shape. With the rectangular, especially square-shaped design of the second cooling body, the effective cooling area can be increased over a circular design thereof.

It is further provided, according to the invention, that the insulator is designed in frame-fashion and with a U-shaped cross section, its short legs enclosing the frame-shaped spring element.

To increase the surface area and to improve the heat removal, it is further provided that the second cooling body has ribs at its radially inward facing portion facing the machine shaft. Depending on how the cooling gas stream is conducted, the ribs can run in the circumferential direction, relative to the shaft in the axial direction or also at an angle to the axis of the machine shaft. With the last-mentioned embodiment, an internal pumping effect is obtained, which is particularly advantageous for the cooling.

In a further embodiment of the arrangement according to the invention, it is provided that the insulator is provided with recesses into which fastening screws are screwed into the first cooling body. The recesses can be holes through the insulator walls or open recesses at the corners, in which the fastening screws are disposed.

In a further embodiment of the invention it is provided that a frame provided with holes, for receiving the fastening screws which are in turn screwed into threaded holes in the first cooling body, rests on that surface of the insulator which faces the machine shaft.

According to the invention, it may be provided that the insulator is pressed against the first cooling body via sealing material. In this manner, the space containing the semiconductor elements can be protected against penetrating dust and dirt.

For conducting the electric current, it is provided in a further embodiment of the invention that a braid serving as the current lead is connected to the second cooling body on the side facing the machine shaft.

In machines of smaller rating, the insulator and the second cooling body can be of ring-shaped or circular design and a circular shaped spring can be arranged therebetween.

Further details and advantageous embodiments of the invention will be seen from the embodiment examples which are described in the following and are shown in the figures.

DESCRIPTION OF THE PREFERRED EMBODIMENTS

In the following description of the preferred embodiments the various surfaces are designated as "radially outwardly facing", if they face in the direction shown by the arrow RO in FIG. 1, and conversely as "radially inwardly facing", if they face in the opposite direction, namely away from the axis of the shaft 53 or toward the axis, respectively.

Figure 1:
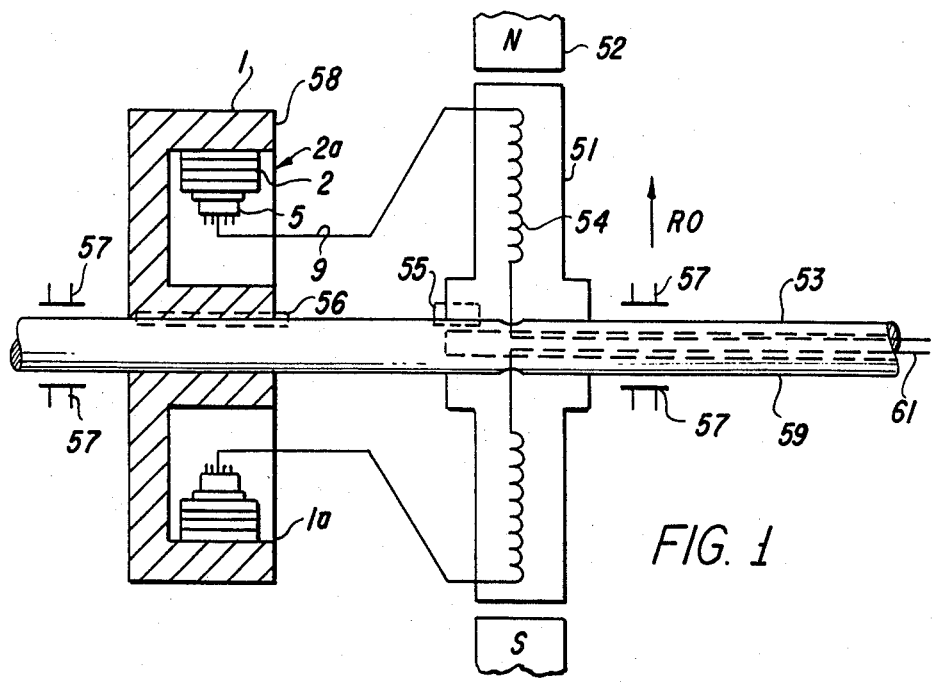
FIG. 1 is a vertical cross-sectional, diagrammatic view through the invention showing the support wheel and an armature of the rectifying device mounted on the same shaft as the armature of the synchronous machine, which is not shown.

The support wheel which has an E-shaped longitudinal cross-section, is designated with 1 in FIG. 1. The machine shaft 53 and the armature 51 of the a-c exciter machine are shown mounted on the machine shaft 53 which also supports the main synchronous machine or turbo generator, which is not shown, since the invention is not directed to the construction of such a generator, but to the means for producing the excitation current for the armature for the main generator. The rotating rectifying device, accordingly, comprises the support wheel 1 which has a circumferential flange 58. The flange 58 has on its radially inwardly facing surface a plurality of radially inwardly facing rectifying devices or assemblies 2 attached to the flange 58.

The plurality of rectifying devices or assemblies is immaterial to the scope of the invention, but depends on the number of phases used in the system. Typically a three or six-phase system is used.

The rotating rectifying device or assembly 2a further includes a rotating armature 51, also mounted on the machine shaft 53, and is rotatable inside a stator 52 with fixed magnetic polarization as shown. The support wheel 1 and the armature 51 are attached by keys 56 and 55, respectively, to the shaft 53 so that they are in fixed angular position to one another. The armature 51 includes a plurality of radially oriented coils 54, each connected at the outer end through an electric conductor 9 to the output terminal of a respective rectifying device or assembly 2a; the inner end of each coil 54 is threaded, through an axially bored hole 59 through the shaft 53 and are seen as conductors 61 at the end of the broken-off shaft end which lead to the main armature of the synchronous generator, which is not shown. Since the conductors 61 are connected in series with the rectifying devices or assemblies 2a, they carry rectified a-c current, in other words, pulsating d-c current. The a-c current is used to magnetize the armature of the synchronous machine.

In the practical realization of the invention, as is well known from the prior art, with a plurality of coils 54 that are mutually offset by a certain phase angle, the resulting rectified d-c current is quite smooth.

Figure 2:
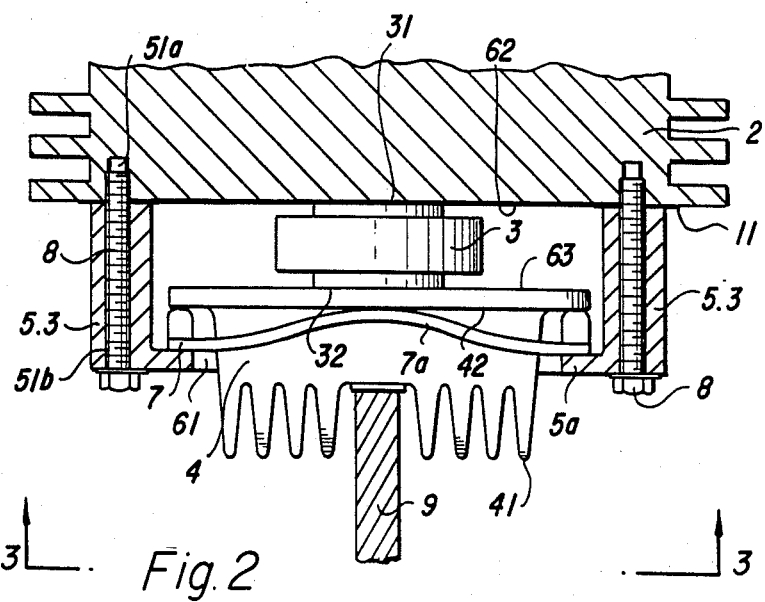
FIG. 2 is a cross sectional vertical view of a rectifying device, showing the two cooling bodies with the disc-shaped rectifier between them, and other elements of the device.

The shaft 53 is supported in antifriction bearings 57, only shown symbolically. As seen in FIGS. 1 and 2, a first cooling body 2 is arranged at the inside radially inwardly facing surface of the support wheel flange 58, and 3 is a disc-shaped semiconductor element. It rests with its one electrode surface 31 (for instance, the cathode) against a radially inwardly facing plane surface 62 of the first cooling body 2. The second electrode surface 32 (for instance, the anode) rests against a plane radially outwardly facing surface 63 of the second cooling body 4. This second cooling body 4 has rectangular shape and has ribs 41 on its radially inwardly facing portion facing the machine shaft. At its radially inwardly facing portion, the second cooling body 4 further has a plane flange surface 42 facing the machine shaft. An elastic thin sealing spacer 11 is interposed between the insulator 5, 3 and the first cooling body 2, if required. For conducting the electric current, a braid 9 is provided which is attached to the second cooling body 4 and extends from the cooling body 4 in the radial direction to the coils 54.

Figure 8:
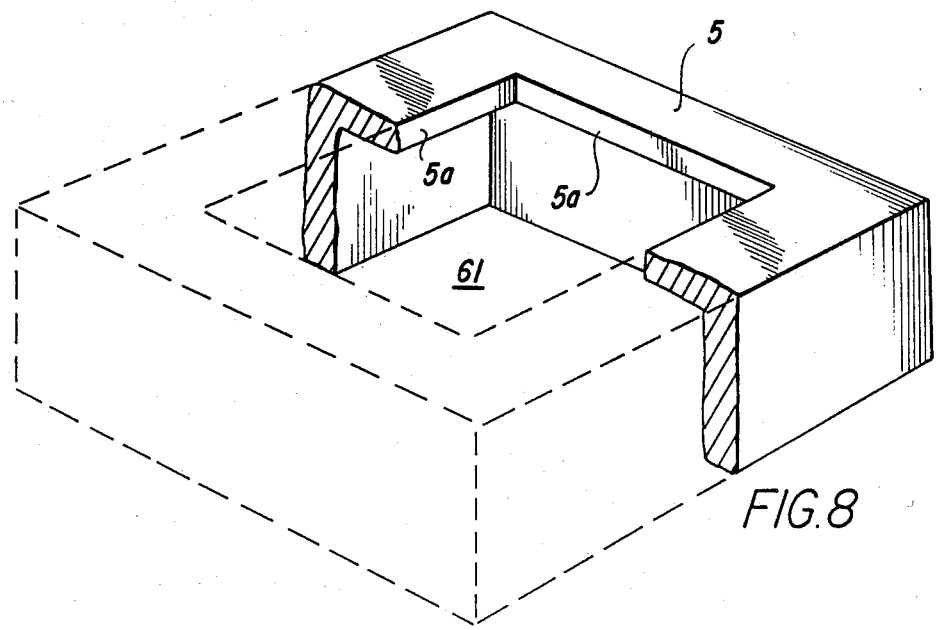
FIG. 8 is a perspective view of a version of the insulator having a U-shaped cross-section with inwardly facing flanges.
Figure 3:
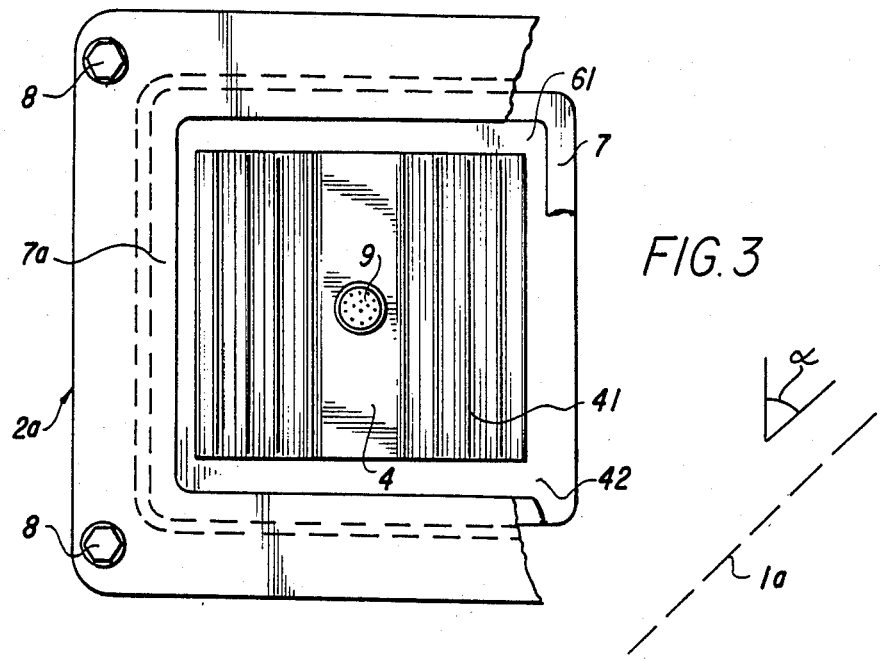
FIG. 3 is a plan view of the rectifying device looking radially outwardly from the machine shaft, showing the radially inwardly facing ribbed surface of the second cooling body, seen along the line 3—3 of FIG. 2.
Figure 13:
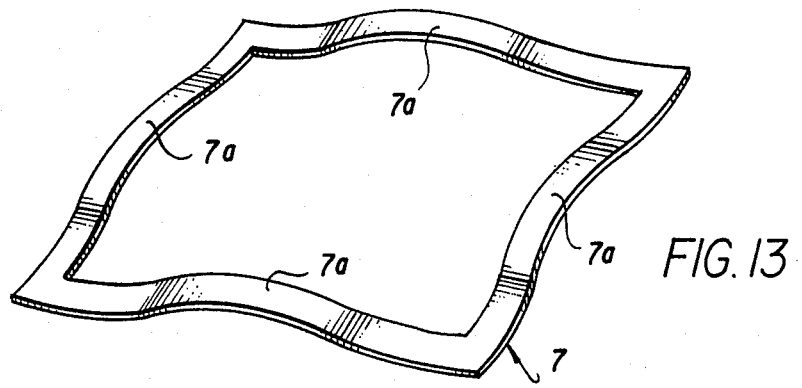
FIG. 13 is a perspective view of the frame-shaped spring element.

On the plane flange surface 42 rests, in the arrangement according to FIGS. 2 and 3, a generally rectangular frame-shaped convex spring element 7 consisting of four side sections 7a seen in more detail in FIG. 13. The side sections are curved in a direction perpendicular to the plane of the spring so that the spring element is resilient and compressable, and the latter spring element 7, interposed in its compressed condition in the space between the radially inwardly facing plane flange surface 42 of aforesaid second cooling body 4 and the radially outwardly facing inner surface of the flanges 5a of a rectangular insulator 5.3, seen in more detail in FIG. 8. The cross-section of the insulator is, broadly speaking, U-shaped as shown by the cross-hatched area in FIG. 8, which results in a box-like structure with a rectangular cutout 61, from which the cooling body 4 protrudes, as seen in FIGS. 2 and 3. The insulator 5.3 is provided at its corners with recesses or holes 51b, in which fastening screws 8 are screwed into the first cooling body 2. In FIGS. 2 and 3, the recesses 51b are shown as holes; however, they may also be open recesses for receiving the fastening screws 8. The fastening screws 8 engage with corresponding tapped holes 51a which are cut into the first cooling body 2. The insulator 5.3 mentioned consists either of a pressure-resistant ceramic material or a temperature-resistant fiberglass-reinforced plastic.

Figure 4:
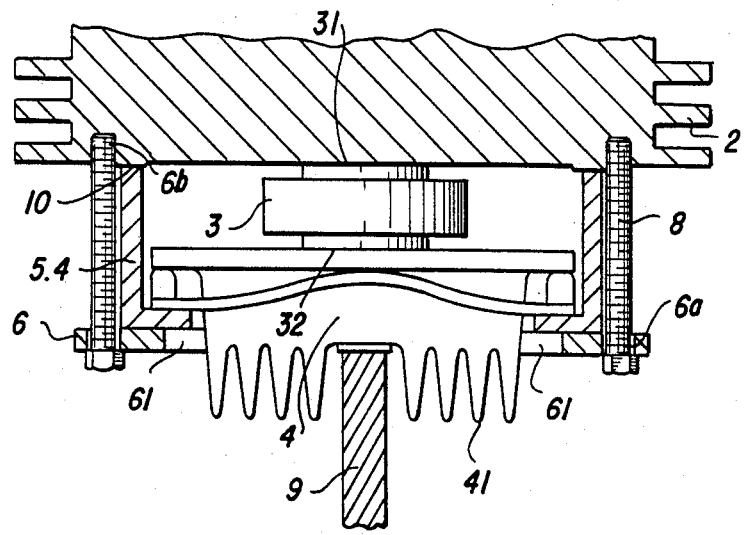
FIG. 4 is a cross-sectional vertical view of the rectifying device according to the second preferred embodiment, having a frame for holding the insulator against the first cooling body.
Figure 14:
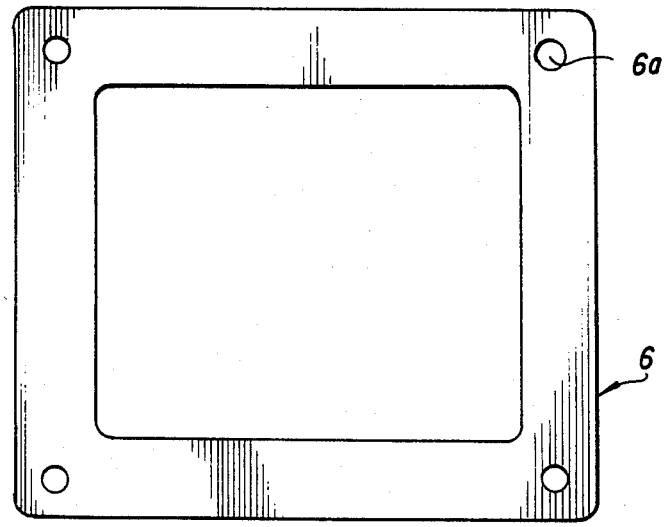
FIG. 14 is a plan view of a frame-shaped element for holding an insulator against the first cooling body.

In the embodiment according to FIG. 4, the insulator 5.4 has no recesses. It is pressed against the cooling first body 2 by a frame-shaped component 6 seen in more detail in FIG. 14, which is provided with recesses at its corners, by means of fastening screws 8 which are screwed into corresponding tapped holes 6b in the first cooling body 2. The insulator 5.4 rests against the cooling body 2 via sealing material 10, interposed between aforesaid cooling body 2 and the insulator 5.4.

Figure 5:
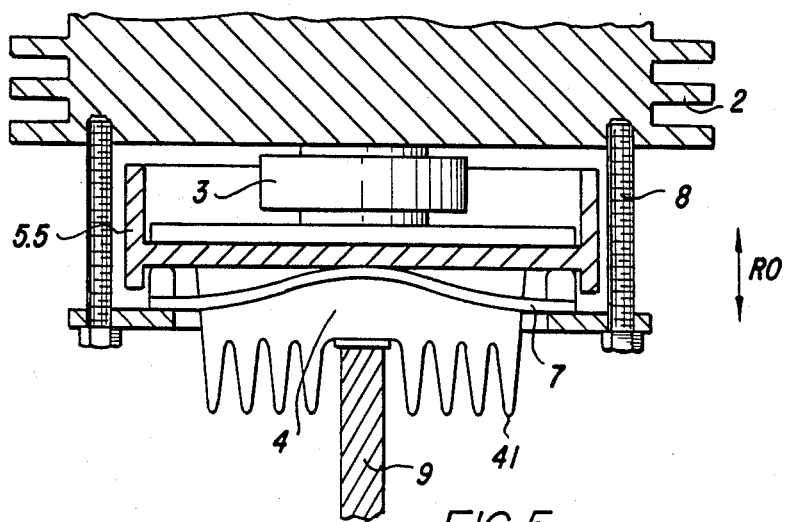
FIG. 5 is a vertical cross-sectional view of still another embodiment, in which the spring element is interposed between the frame and the insulator.

Contrary to FIG. 4, the insulator 5.5 in FIG. 5 is made shorter in the radial direction, again indicated by the arrow RO ("Radially Outwardly"), so that the insulator does not rest directly against the first cooling body 2. This prevents it from being subjected to a bending stress, so that an elastic spacer (11 in FIG. 2) can be dispensed with altogether.

Figure 6:
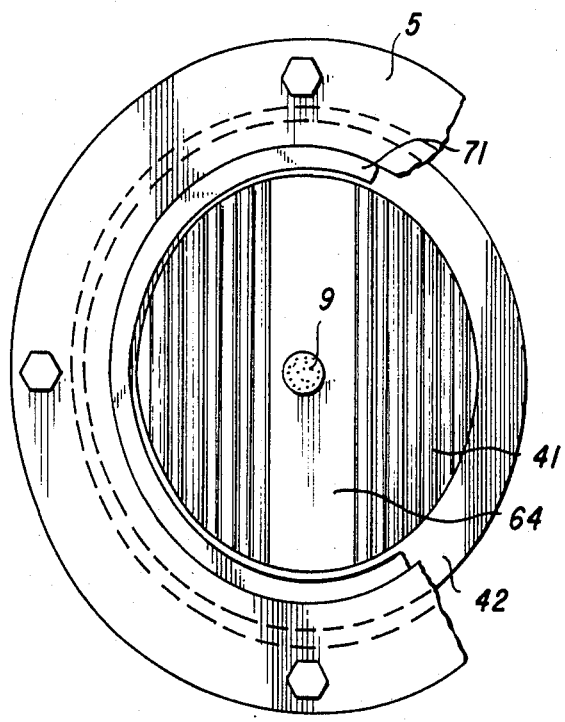
FIG. 6 is a plan view of the rectifying device having a circular construction, facing radially inwardly toward the machine shaft, showing the radially inwardly facing ribbed surface of the circular second cooling body.
Figure 7:
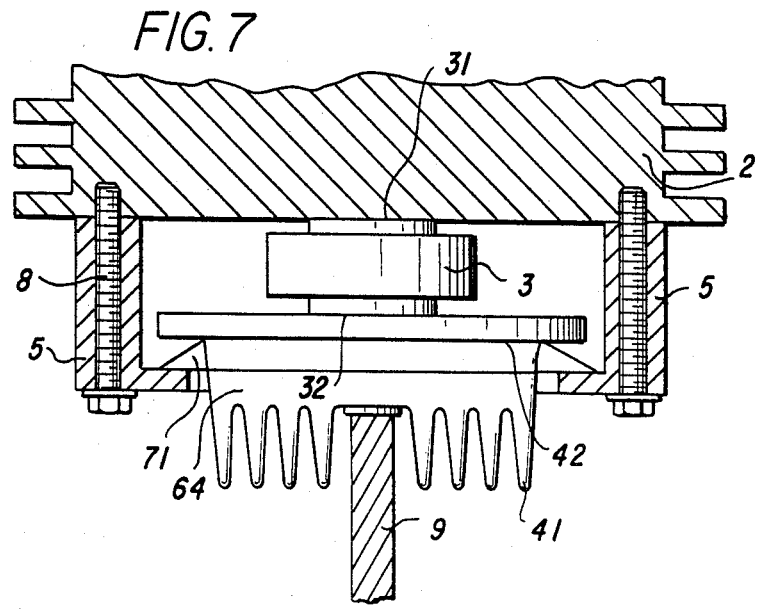
FIG. 7 is a vertical cross-sectional view of the circular construction of the rectifying device.
Figure 9:
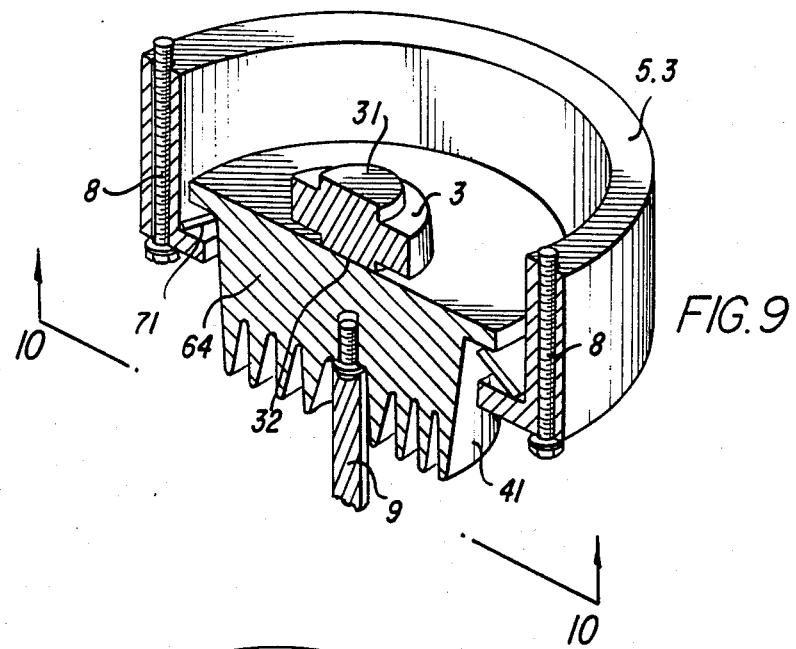
FIG. 9 is a perspective, partly cross-sectional view of the circular construction of the rectifying device.
Figure 10:
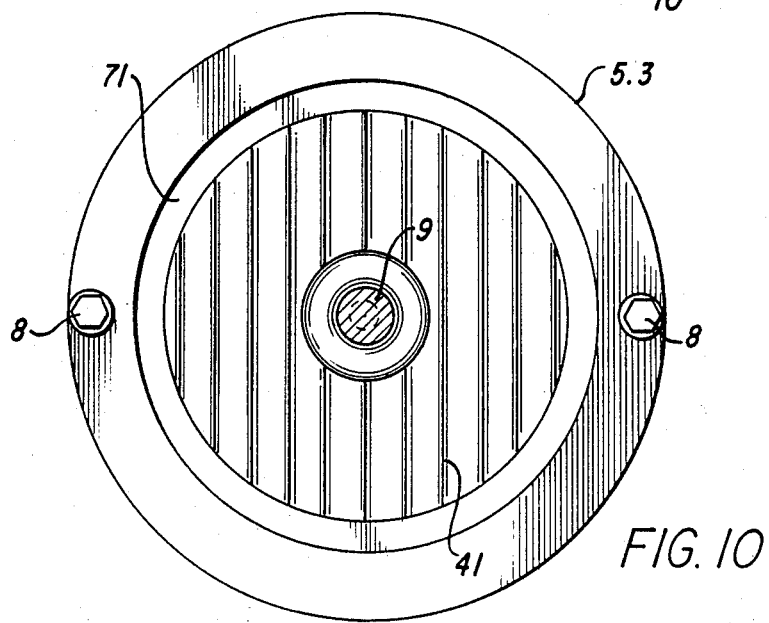
FIG. 10 is a plan view of the circular construction of the rectifying device seen along the line 10—10 of FIG. 9.
Figure 11:
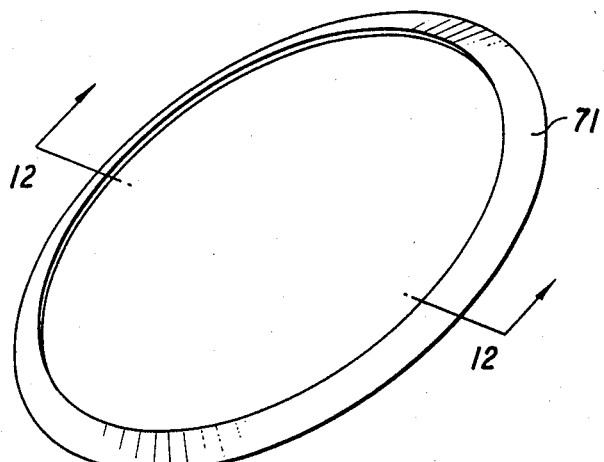
FIG. 11 is a perspective view of the cup-shaped spring element used in the circular embodiment of the invention.
Figure 12:
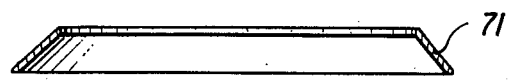
FIG. 12 is a cross-sectional view of the cup-shaped spring element seen along the line 12—12 of FIG. 11.

FIG. 3 shows that the rectifying device or assembly 2a can be mounted inside the flange 58 of the support wheel 1 (FIG. 1) with the ribs 41 of the second cooling body 4 set at an angle alpha with the rim 1a, shown by a dashed line in FIG. 3, of the flange 58 of the support wheel 1. As a result of the rotation of the support wheel 1, it is clearly seen that the ribs 41, when placed at an angle, alpha will act as slanted fan blades that will tend to enhance airflow of the cooling air over the second cooling body 4. It follows that the angle alpha will be represented by an angle between the cooling ribs 41 and the shaft 53, which is equal to 90° alpha. In the machines of smaller rating the insulator 5.3 (FIGS. 9 and 10) and the second cooling body 64 (FIGS. 6 and 7), a ring-shaped spring 71 (FIG. 9) can be arranged therebetween.

The invention is used for the exciter apparatus of synchronous machines, especially of turbo-generators for producing electric power.

We claim:

1. Rotating rectifying device for the excitation of a synchronous machine having a shaft defining an axis, the device which comprises:
    an armature having coils mounted on said shaft for rotation in a magnetic field,
    a support wheel mounted on said shaft having a peripheral flange having a radially inwardly facing flange surface for mounting a plurality of rectifier assemblies, each rectifier assembly which includes:
    a first cooling body mounted on the inwardly facing flange surface, having a radially inwardly facing plane surface;
    a disc-shaped semiconductor element resting with an outwardly facing disc surface against said radially inwardly facing plane surface, and having an inwardly facing disc surface;
    a second cooling body having a plane radially outwardly facing surface resting against said inwardly facing disc surface,
    an insulator having flanges having radially outwardly facing inner flange surfaces for holding the second cooling body against the semiconductor element;
    a spring element disposed between said second cooling body and said insulator;
    an electric conductor connecting said second cooling body with said armature.

2. Rotating rectifying device according to claim 1 wherein said spring element is disposed between a radially inwardly facing plane flange surface of the second cooling body and an inner flange surface of said insulator.

3. Rotary rectifying device according to claim 2 wherein said spring element is frame-shaped and includes at least two resilient, curved side sections for providing radial spring bias between said inner flange surface and said plane flange surface.

4. Rotating rectifying device according to claim 2 wherein said insulator has a U-shaped cross-section taken along an intersecting plane perpendicular to said axis and a rectangular cross-section taken along a plane parallel with said axis.

5. Rotating rectifying device according to claim 1 further comprising cooling ribs, said ribs being parallel and radially inwardly facing.

6. Rotating rectifying device according to claim 5 wherein the ribs are oriented in a direction that is circumferential to said axis.

7. Rotating rectifying device according to claim 5, wherein the ribs are oriented in a direction that forms an angle with said axis.

8. Rotating rectifying device according to claim 1, wherein said insulator comprises recesses and said first cooling body has holes aligned with said recesses for threadedly receiving screws for mounting said insulator to said first cooling body.

9. Rotating rectifying device according to claim 2, further comprising: a frame having holes; and tapped holes in said first cooling body aligned with said holes for threadedly receiving screws, for holding said frame securely against the radially inwardly facing surface of said insulator for securing said insulator against the inwardly facing said plane surface of the first cooling body.

10. Rotating rectifying device according to claim 1, further comprising a sealing layer disposed between the radially outwardly facing edges of the insulator and said inwardly facing surface of the first cooling body.

11. Rotating rectifying device according to claim 1, wherein said electric conductor is a braided conductor attached at one end to the second cooling body, and at the other end to one end of said coils.

12. Rotating rectifying device according to claim 2, wherein said insulator includes a wall which is perpendicular to said radially inwardly facing plane surface, and has a circular cross-section taken along a plane parallel with said radially inwardly facing plane surface, and wherein said second cooling body is of circular design disposed within the insulator wall, and wherein said spring element is a circular spring disposed between said radially outwardly facing inner flange surfaces of the insulator flange and the radially inwardly facing plane flange surface of the second cooling body for resiliently biasing the second cooling body in the radially outwardly facing direction against the inwardly facing disc surface.

* * * * *